United States Patent
Chuang et al.

(10) Patent No.: US 8,169,000 B2
(45) Date of Patent: May 1, 2012

(54) LATERAL TRANSIENT VOLTAGE SUPPRESSOR WITH ULTRA LOW CAPACITANCE

(75) Inventors: Che-Hao Chuang, Hsinchu (TW); Kun-Hsien Lin, Hsinchu (TW); Ryan Hsin-Chin Jiang, Taipei (TW)

(73) Assignee: Amazing Microelectronic Corp., Taipei County (TW)

( * ) Notice: Subject to any disclaimer, the term of this patent is extended or adjusted under 35 U.S.C. 154(b) by 98 days.

(21) Appl. No.: 12/836,785

(22) Filed: Jul. 15, 2010

(65) Prior Publication Data

US 2012/0012973 A1    Jan. 19, 2012

(51) Int. Cl.
*H01L 23/62* (2006.01)

(52) U.S. Cl. . 257/173; 257/355; 257/506; 257/E29.327; 361/91.5

(58) Field of Classification Search .................. 257/106, 257/173, 506, 510, 603, E27.051, E29.327, 257/355; 361/91.5
See application file for complete search history.

(56) References Cited

U.S. PATENT DOCUMENTS

| | | | |
|---|---|---|---|
| 6,560,086 B2 * | 5/2003 | Mechanic | 361/111 |
| 7,361,942 B1 | 4/2008 | Matteson et al. | |
| 7,538,395 B2 | 5/2009 | Keena et al. | |
| 7,579,632 B2 | 8/2009 | Salih et al. | |
| 7,781,826 B2 * | 8/2010 | Mallikararjunaswamy et al. | 257/328 |
| 7,880,223 B2 * | 2/2011 | Bobde | 257/328 |
| 2011/0163352 A1 * | 7/2011 | Gee et al. | 257/173 |

* cited by examiner

*Primary Examiner* — Tuan N. Quach
(74) *Attorney, Agent, or Firm* — Muncy, Geissler, Olds & Lowe, PLLC (57) ABSTRACT

A lateral transient voltage suppressor with ultra low capacitance is disclosed. The suppressor comprises a first conductivity type substrate and at least one diode cascade structure arranged in the first conductivity type substrate. The cascade structure further comprises at least one second conductivity type lightly doped well and at least one first conductivity type lightly doped well, wherein there are two heavily doped areas arranged in the second conductivity type lightly doped well and the first conductivity type lightly doped well. The cascade structure neighbors a second conductivity type well, wherein there are three heavily doped areas arranged in the second conductivity type well. The suppressor further comprises a plurality of deep isolation trenches arranged in the first conductivity type substrate and having a depth greater than depths of the second conductivity type lightly doped well, the second conductivity type well and the first conductivity type lightly doped well. Each doped well is isolated by trenches.

14 Claims, 7 Drawing Sheets

LATERAL TRANSIENT VOLTAGE SUPPRESSOR WITH ULTRA LOW CAPACITANCE

BACKGROUND OF THE INVENTION

1. Field of the Invention

The present invention relates to a lateral transient voltage suppressor, particularly to a lateral transient voltage suppressor with ultra low capacitance.

2. Description of the Related Art

Figure 1:
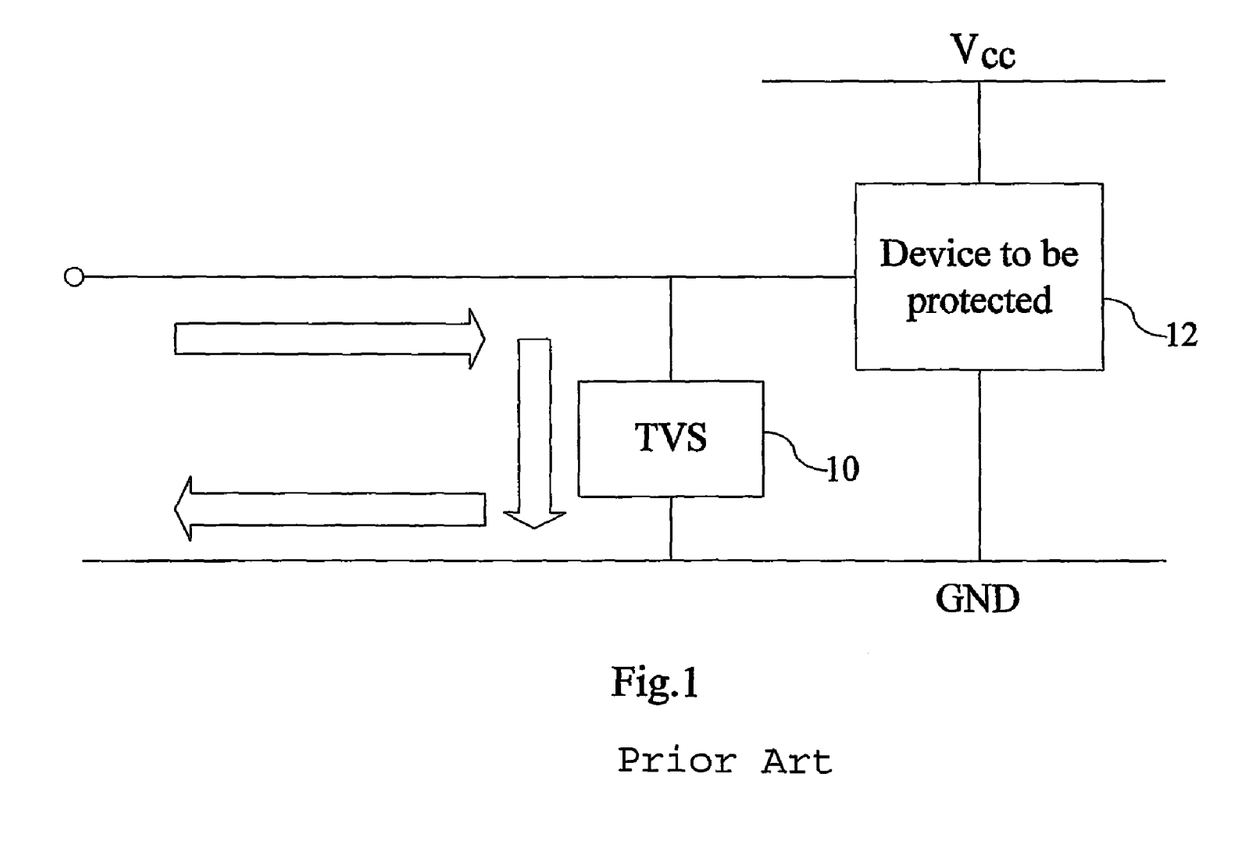
FIG. 1 is a circuit diagram showing a transient voltage suppressor connected with a protected circuit according to the prior art.

Because the IC device sizes have been shrunk to nanometer scale, the consumer electronics, like the laptop and mobile devices, have been designed to be much smaller than ever. Without suitable protection devices, the functions of these electronics could be reset or even damaged under ESD (Electrostatic Discharge) events. Currently, all consumer electronics are expected to pass the ESD test requirement of IEC 61000-4-2 standard. TVS (Transient Voltage Suppressor) is generally designed to bypass the ESD energy, so that the electronic systems can be prevented from ESD damages. The working principle of TVS is shown in FIG. 1. In FIG. 1, the TVS devices 10 are connected in parallel with the protected circuits 12 on the PCB (Printed Circuit Board). These TVS devices 10 would be triggered immediately when the ESD event is occurred. In that way, each TVS device 10 can provide a superiorly low resistance path for discharging the transient ESD current, so that the energy of the ESD transient current can be bypassed by the TVS devices 10.

Figure 2:
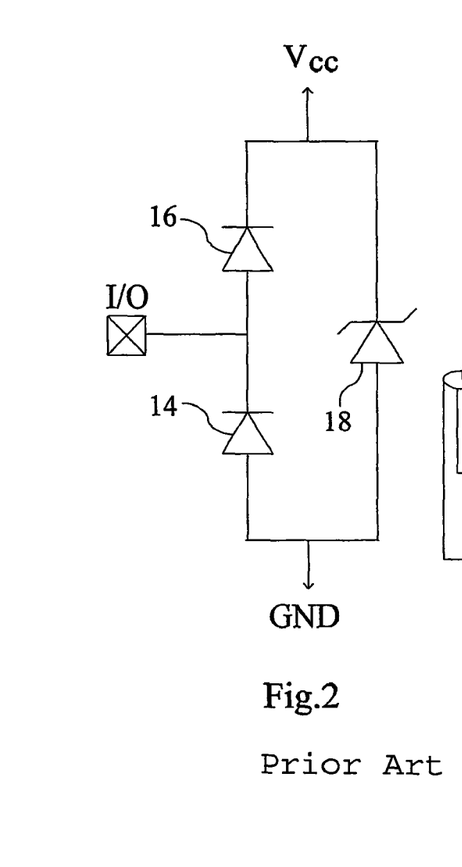
FIG. 2 is a circuit diagram showing the transient voltage suppressor according to the prior art.
Figure 3:
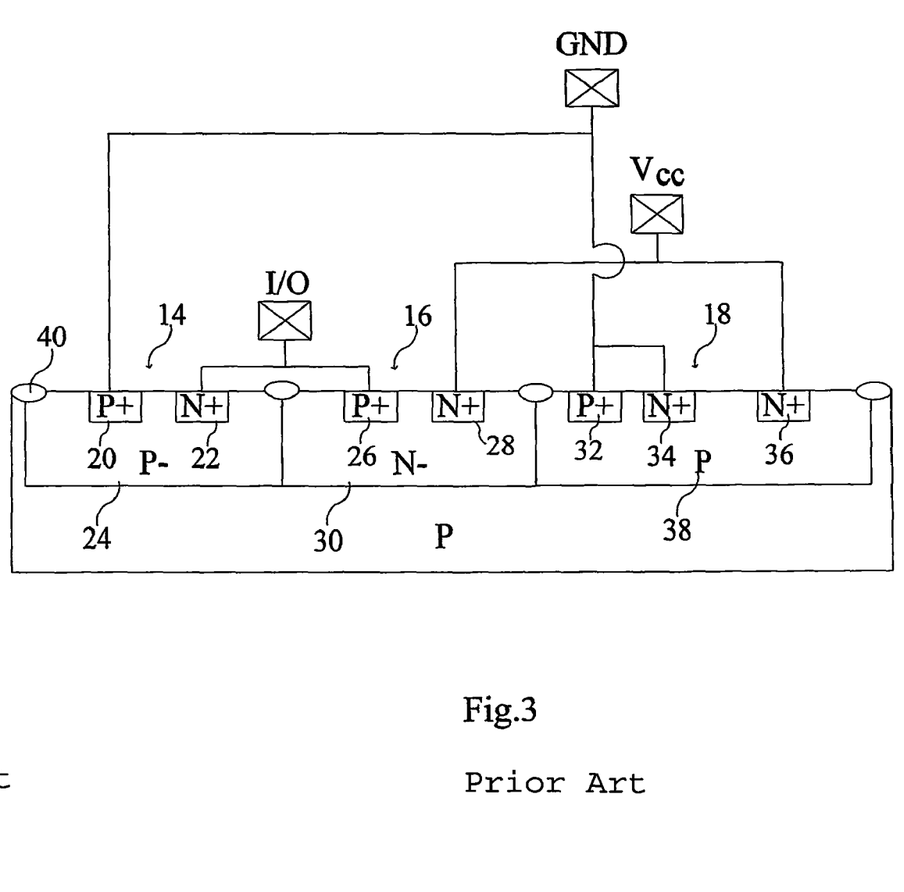
FIG. 3 is a sectional view schematically showing the transient voltage suppressor according to the prior art.

As shown in FIG. 2 and FIG. 3, the traditional TVS comprises a first diode 14, a second diode 16, and a zener diode 18. The first diode 14 is formed by a P-type heavily doped area 20, an N-type heavily doped area 22, and a P-type lightly doped well 24. The second diode 16 is formed by a P-type heavily doped area 26, an N-type heavily doped area 28, and an N-type lightly doped well 30. The zener diode 18 is formed by a P-type heavily doped area 32, two N-type heavily doped area 34 and 36, and a P-type doped well 38. Also, each doped well is isolated by a field oxide 40. However, after well drive-in process, the dosage of the P-type lightly doped well 24 and the N-type lightly doped well 30 will be still affected by the P-type doped well 38 and increased, which results in high input capacitance of the traditional TVS.

For high speed interface applications, such as Gigabit Ethernet, USB3.0 . . . , etc, the input capacitance of TVS should be designed as small as possible for better signal performance. However, the TVS device size should be designed large for better ESD performance which causes the large input capacitance. Therefore, how to reduce input capacitance of TVS device without reducing device size is a challenge.

To overcome the abovementioned problems, the present invention provides a lateral transient voltage suppressor with ultra low capacitance, so as to solve the afore-mentioned problems of the prior art.

SUMMARY OF THE INVENTION

A primary objective of the present invention is to provide a lateral transient voltage suppressor, which adopts deep isolation trenches to separate each doped well arranged in the substrate, so as to obtain the ultra low input capacitance. The ultra low input capacitance of the suppressor can not only benefit the signal performance but be achieved for high speed interface application.

To achieve the abovementioned objectives, the present invention provides a lateral transient voltage suppressor with ultra low capacitance, which comprises a first conductivity type substrate and at least one diode cascade structure arranged in the first conductivity type substrate. The cascade structure further comprises at least one second conductivity type lightly doped well and at least one first conductivity type lightly doped well, wherein a first and second heavily doped areas are arranged in the second conductivity type lightly doped well, and wherein a third and fourth heavily doped areas are arranged in the first conductivity type lightly doped well. As to the conductivity type of each doped area, the first heavily doped area and the second heavily doped area respectively belong to opposite conductivity types; the third heavily doped area and the fourth heavily doped area respectively belong to opposite conductivity types; the second heavily doped area and the third heavily doped area respectively belong to opposite conductivity types, and wherein the second heavily doped area is connected with the third heavily doped area.

The cascade structure neighbors a second conductivity type well, wherein a fifth, sixth, and seventh heavily doped areas are arranged in the second conductivity type well. The conductivity type of the fifth heavily doped area is opposite to the conductivity type of the sixth and seventh heavily doped areas. The suppressor further comprises a plurality of deep isolation trenches arranged in the first conductivity type substrate and having a depth greater than depths of the second conductivity type lightly doped well, the second conductivity type well and the first conductivity type lightly doped well. Each doped well is isolated by trenches.

Below, the embodiments are described in detail in cooperation with the drawings to make easily understood the technical contents, characteristics and accomplishments of the present invention.

DETAILED DESCRIPTION OF THE INVENTION

Figure 4:
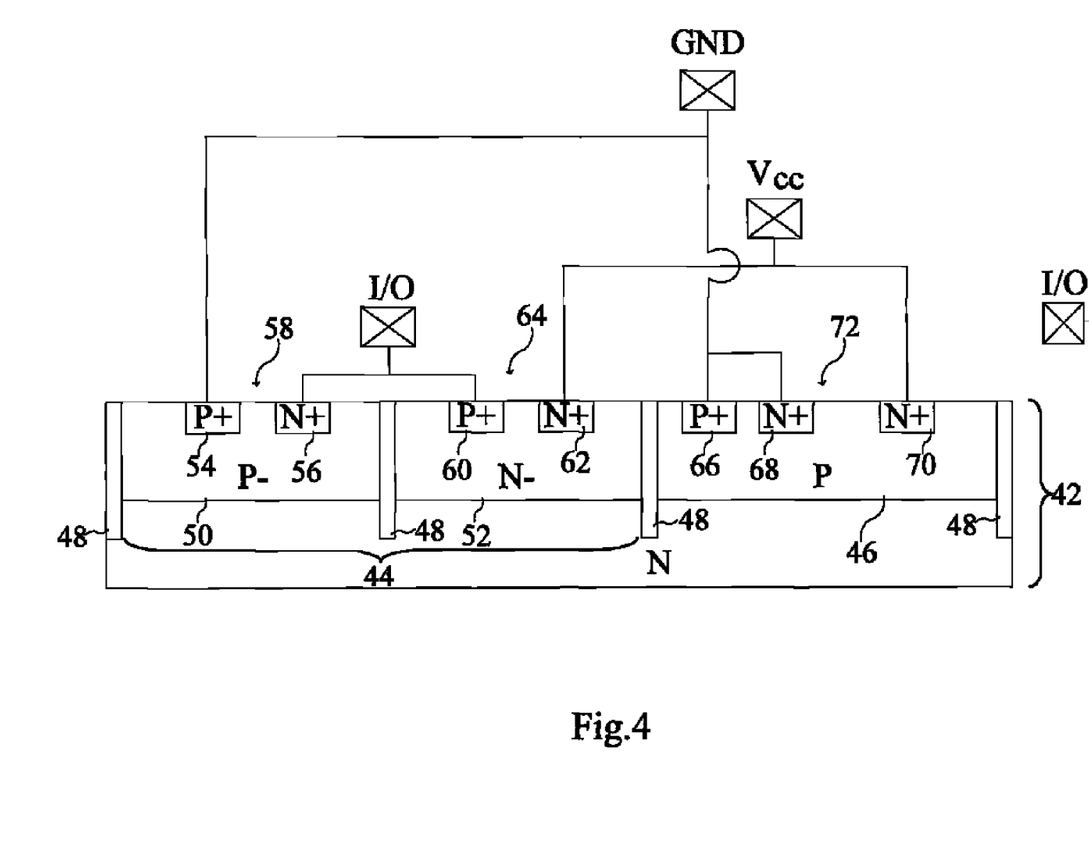
FIG. 4 is a sectional view schematically showing a transient voltage suppressor according to the first embodiment of the present invention.
Figure 5:
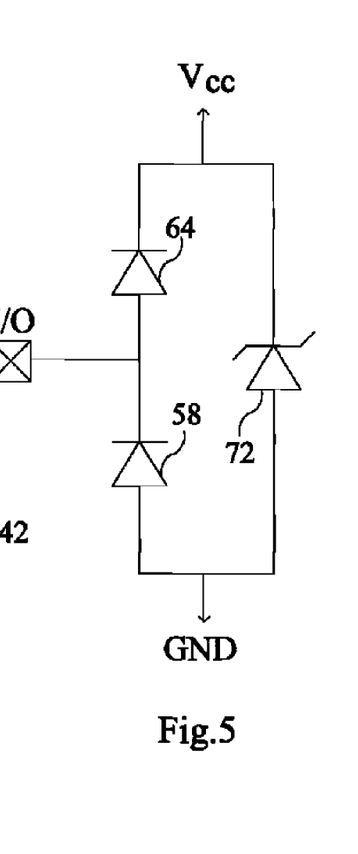
FIG. 5 is a circuit diagram showing the transient voltage suppressor according to the first embodiment of the present invention.

Refer to FIG. 4 and FIG. 5, wherein FIG. 5 is an equivalent circuit of FIG. 4. The transient voltage suppressor (TVS) of the present invention comprises a first conductivity type substrate 42. At least one diode cascade structure 44, a second conductivity type well 46, and a plurality of deep isolation trenches 48 are all arranged in the first substrate 42. The second conductivity type well 46 neighbors the diode cascade structure 44. For much reduced the input capacitance of the present invention, the diode cascade structure 44 comprises at least one second conductivity type lightly doped well 50 arranged in the first substrate 42 and at least one first conductivity type lightly doped well 52 arranged in the first substrate 42. In the first embodiment, the numbers of the diode cascade structure 44, the second conductivity type lightly doped well 50, and the first conductivity type lightly doped well 52 are all one, which is used as an example. And, for example, the first conductivity type substrate 42 is an N-type substrate, the second conductivity type well 46 is a P-type well, the second conductivity type lightly doped well 50 is a P-type lightly doped well, and the first conductivity type lightly doped well 52 is an N-type lightly doped well. The second conductivity type lightly doped well 50 neighbors the first conductivity type lightly doped well 52, and the first conductivity type lightly doped well 52 neighbors the second conductivity type well 46. A deep isolation trench 48 located between the second conductivity type lightly doped well 50 and the first conductivity type lightly doped well 52 is adjacent to them. And a deep isolation trench 48 located between the first conductivity type lightly doped well 52 and the second conductivity type well 46 is adjacent to them. The deep isolation trenches 48 comprising dielectric material not only have the depth greater than depths of the second conductivity type lightly doped well 50, the second conductivity type well 46 and the first conductivity type lightly doped well 52 but separate the second conductivity type lightly doped well 50, the second conductivity type well 46 and the first conductivity type lightly doped well 52.

A first heavily doped area 54 and a second heavily doped area 56 are arranged in the second conductivity type lightly doped well 50, wherein the first heavily doped area 54 and the second heavily doped area 56 respectively belong to opposite conductivity types. Specifically, the first heavily doped area 54 and the second conductivity type lightly doped well 50 belong to the same conductivity type; and the second heavily doped area 56 and the first conductivity type substrate 42 belong to the same conductivity type. A first diode 58 is formed by the first heavily doped area 54, the second heavily doped area 56, and the second conductivity type lightly doped well 50.

A third heavily doped area 60 and a fourth heavily doped area 62 are arranged in the first conductivity type lightly doped well 52, wherein the third heavily doped area 60 and the fourth heavily doped area 62 respectively belong to opposite conductivity types, and wherein the second heavily doped area 56 and the third heavily doped area 60 respectively belong to opposite conductivity types. Specifically, the third heavily doped area 60 and the first heavily doped area 54 belong to the same conductivity type; and the fourth heavily doped area 62 and the second heavily doped area 56 belong to the same conductivity type. A second diode 64 is formed by the third heavily doped area 60, the fourth heavily doped area 62, and the first conductivity type lightly doped well 52. In addition, the second heavily doped area 56 is connected with the third heavily doped area 60, and the second heavily doped area 56 and the third heavily doped area 60 are jointly connected with an I/O lead.

A fifth heavily doped area 66, a sixth heavily doped area 68 and a seventh heavily doped area 70 are arranged in the second conductivity type well 46, wherein the conductivity type of the fifth heavily doped area 66 is opposite to the conductivity type of the sixth and the seventh heavily doped areas 68 and 70. Specifically, the fifth heavily doped area 66 and the third heavily doped area 60 belong to the same conductivity type, wherein the sixth heavily doped area 68, the seventh heavily doped area 70 and the fourth heavily doped area 62 belong to the same conductivity type. The first, fifth and sixth heavily doped areas 54, 66, and 68 are connected with a low voltage, such as a ground voltage. The fourth and seventh heavily doped areas 62 and 70 are connected with a high voltage Vcc. A zener diode 72 is formed by the fifth heavily doped area 66, the sixth heavily doped area 68 and the seventh heavily doped area 70, and the second conductivity type well 46.

When the suppressor is biased, the electrostatic discharge (ESD) current flowing these doped wells is a lateral path. After drive-in process, the second conductivity type lightly doped well 50 and the first conductivity type lightly doped well 52 will not be affected by the second conductivity type well 46 due to the deep isolation trenches 48. Therefore, the present invention not only has the ultra low input capacitance to benefit the signal performance but be achieved for high speed interface application.

The first embodiment is shown by another conductivity type. When the first conductivity type substrate 42 and the first conductivity type lightly doped well 52 are respectively a P-type substrate and a P-type lightly doped well, the second conductivity type lightly doped well 50 and the second conductivity type well 46 are respectively an N-type lightly doped and an N-type well. And then, the first, second, third, fourth, fifth, sixth, and seventh heavily doped area 54, 56, 60, 62, 66, 68, and 70 corresponds to the conductivity type of the substrate 42 and each doped well 50, 52, and 46 to be changed. Beside, the first, fifth and sixth heavily doped areas 54, 66, and 68 are connected with the high voltage Vcc. The fourth and seventh heavily doped areas 62 and 70 are connected with the low voltage.

Figure 6:
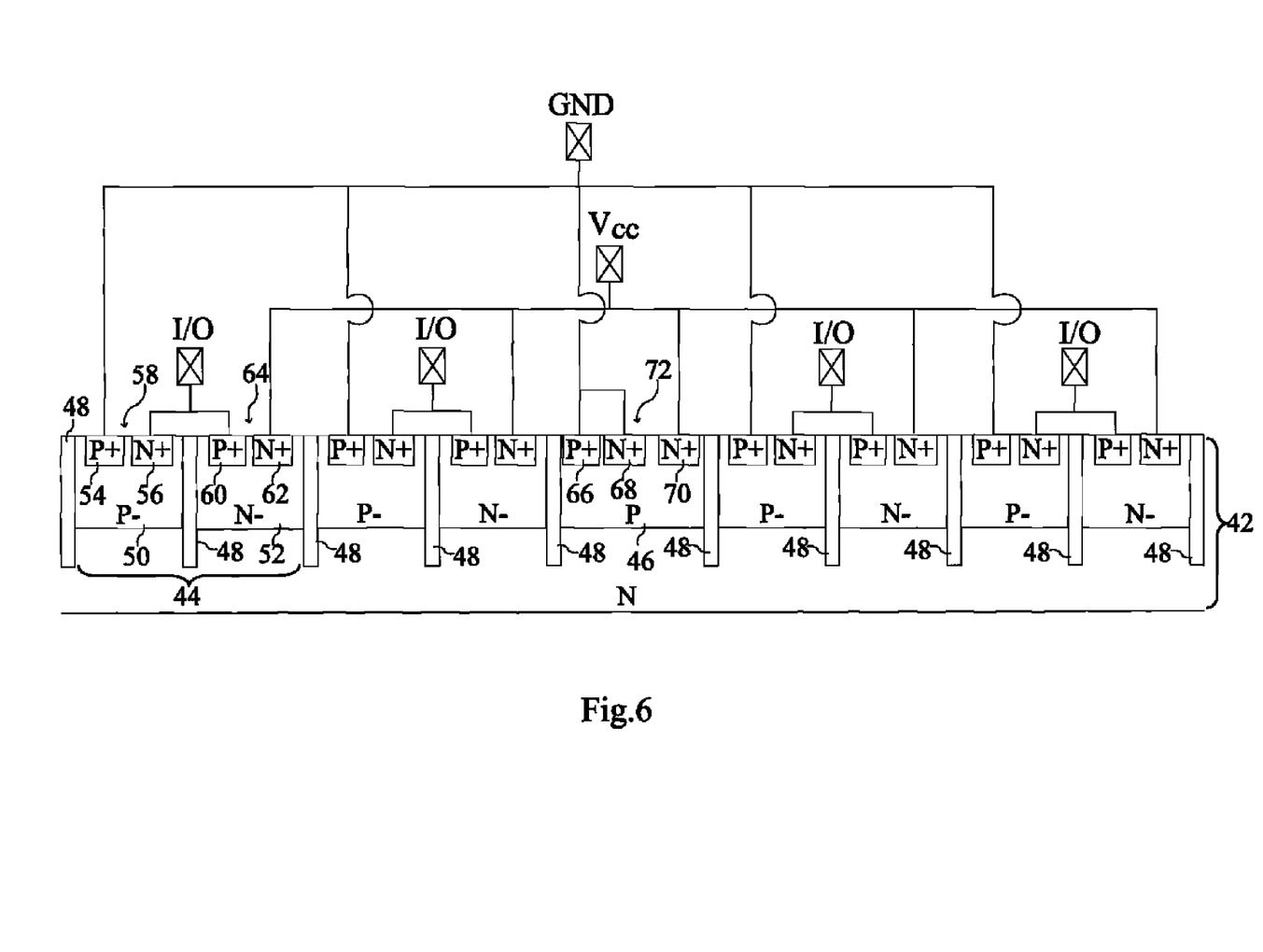
FIG. 6 is a sectional view schematically showing a transient voltage suppressor according to the second embodiment of the present invention.
Figure 7:
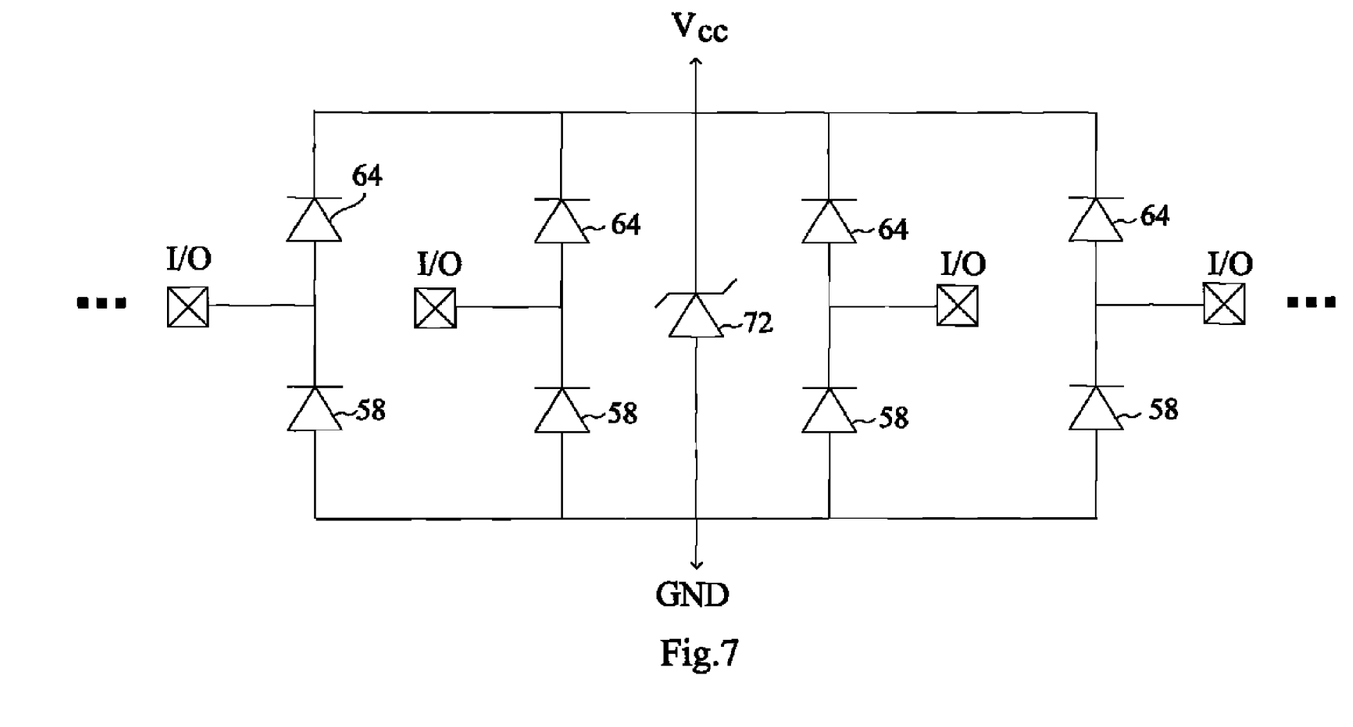
FIG. 7 is a circuit diagram showing the transient voltage suppressor according to the second embodiment of the present invention.

The second embodiment is introduced as below. Refer to FIG. 6 and FIG. 7, wherein FIG. 7 is equivalent circuit of FIG. 6. FIG. 7 shows the TVS with multiple channels. The second embodiment is different from the first embodiment in that there is a plurality of the diode cascade structures 44 horizontally arranged in the first conductivity type substrate 42. Also, the second heavily doped areas 56 and 60 of each diode cascade structure 44 are both connected with an I/O lead. The first heavily doped area 54 of each diode cascade structure 44, the fifth and sixth heavily doped areas 66, and 68 are connected with the low voltage. The fourth heavily doped area 62 of each diode cascade structure 44 and the seventh heavily doped area 70 are connected with the high voltage Vcc.

Moreover, the diode cascade structures 44 cluster together, and two among them neighbor the second conductivity type well 46. As to each diode cascade structure 44, a deep isolation trenches 48 located between the second conductivity type lightly doped well 50 and the first conductivity type lightly doped well 52 is adjacent to them. Besides, a deep isolation trench 48 located between the two neighboring diode cascade structures 44 is adjacent to them. A deep isolation trench 48 located between the diode cascade structures 44 and the second conductivity type well 46 is adjacent to them. In other words, the deep isolation trenches 48 can further separate the diode cascade structures 44 whereby each doped well is isolated.

The well drive-in process of the second embodiment are identical to that of the first embodiment, and have been described previously so will not be reiterated.

The second embodiment is shown by another conductivity type. When the first conductivity type substrate 42 and the first conductivity type lightly doped wells 52 are respectively a P-type substrate and P-type lightly doped wells, the second conductivity type lightly doped well 50 and the second conductivity type well 46 are respectively N-type lightly doped wells and an N-type well. And then, the first, second, third, and fourth heavily doped areas 54, 56, 60, and 62 of each diode cascade structure 44 and the fifth, sixth, and seventh 66, 68, and 70 heavily doped areas correspond to the conductivity type of the substrate 42 and each doped well 50, 52, and 46 to be changed. Beside, the first heavily doped area 54 of each diode cascade structure 44, the fifth and sixth heavily doped areas, 66 and 68 are connected with the high voltage Vcc. The fourth heavily doped area 62 of each diode cascade structure 44 and the seventh heavily doped area 70 are connected with the low voltage.

Figure 8:
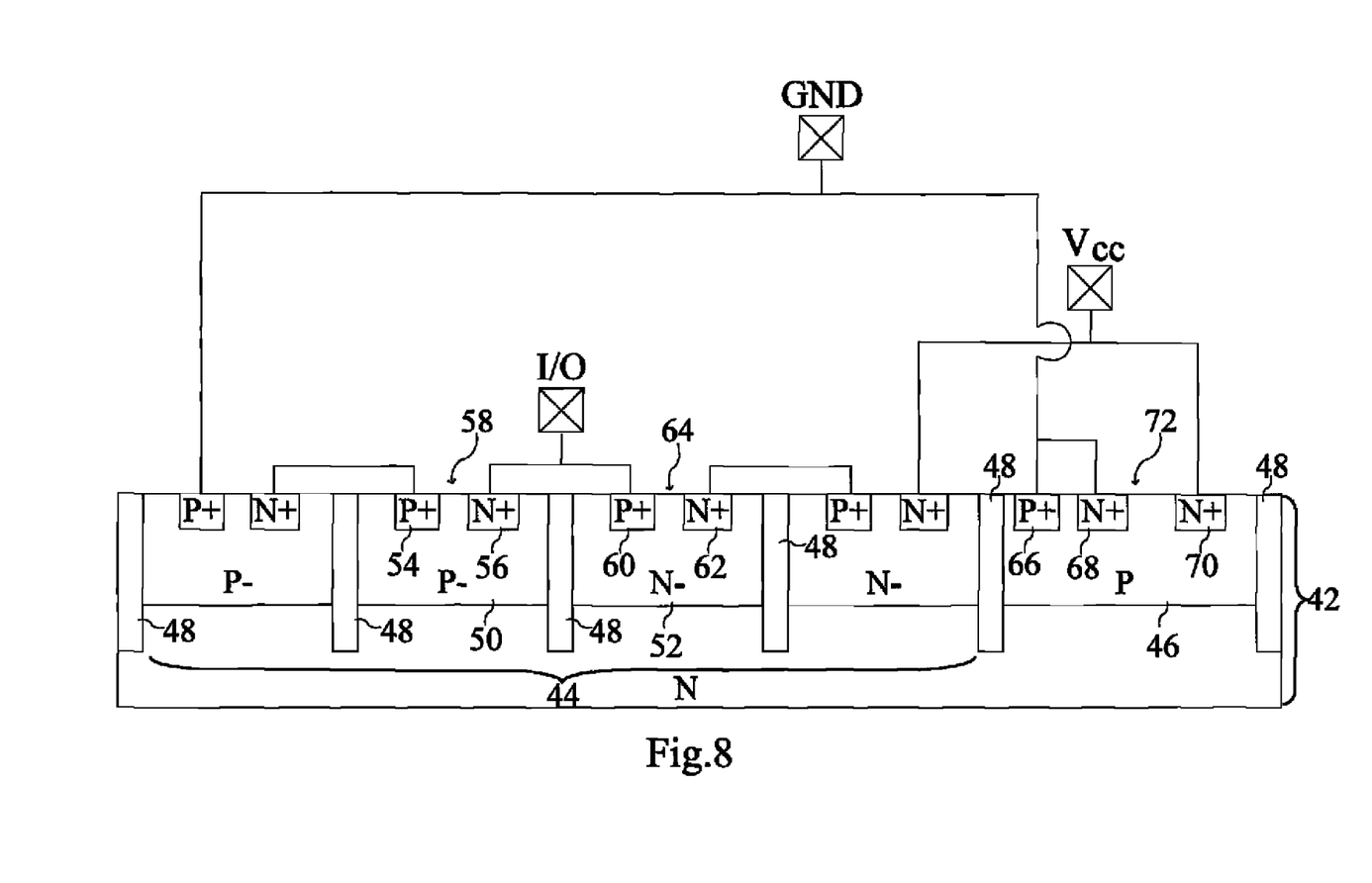
FIG. 8 is a sectional view schematically showing a transient voltage suppressor according to the third embodiment of the present invention.
Figure 9:
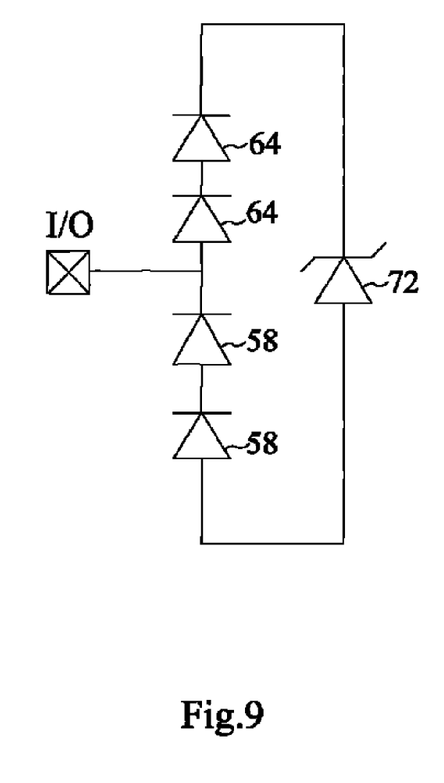
FIG. 9 is a circuit diagram showing the transient voltage suppressor according to the third embodiment of the present invention.

To further reduce the input capacitance of TVS, the present invention provides the third embodiment. The third embodiment is introduced as below. Refer to FIG. 8 and FIG. 9, wherein FIG. 9 is equivalent circuit of FIG. 8. The third embodiment is different from the first embodiment in that there are a plurality of the second conductivity type lightly doped well 50 horizontally arranged in the first conductivity type substrate 42 and a plurality of the first conductivity type lightly doped well 52 horizontally arranged in the first conductivity type substrate 42. To describe the third embodiment clearly, the numbers of the second conductivity type lightly doped well 50 and the first conductivity type lightly doped well 52 are both two, which is used as an example. The second conductivity type lightly doped wells 50 cluster together, and the first conductivity type lightly doped wells 52 cluster together. One of the first conductivity type lightly doped wells 52 neighbors the second conductivity type well 46. The second conductivity type lightly doped wells 50 are cascaded via connecting the first and second heavily doped areas 54 and 56, and the first conductivity type lightly doped wells 52 are cascaded via connecting the third and fourth heavily doped areas 60 and 62. Besides, one second conductivity type lightly doped well 50 is connected with one first conductivity type lightly doped well 52 most near to it via connecting the second heavily doped area 56 and the third heavily doped area 60. Also, the second heavily doped area 56 and the third heavily doped area 60 connected with each other are connected with an I/O lead.

In the third embodiment, the left most second conductivity type lightly doped well 50 is regarded as the first second conductivity type lightly doped well 50, and the most right first conductivity type lightly doped well 52 is regarded as the last first conductivity type lightly doped well 52. The first heavily doped area 54 of the first second conductivity type lightly doped well 50, the fifth and sixth heavily doped areas 66, and 68 are connected with the low voltage. Also, the fourth heavily doped area 62 of the last first conductivity type lightly doped well 52 and the seventh heavily doped area 70 are connected with the high voltage Vcc, whereby the first and second heavily doped areas 54 and 56 of the second conductivity type lightly doped wells 50, and the third and fourth heavily doped areas 60 and 62 of the first conductivity type lightly doped wells 52 are all biased.

A deep isolation trenches 48 located between the second conductivity type lightly doped well 50 and the first conductivity type lightly doped well 52 is adjacent to them. Besides, a deep isolation trench 48 located between the two neighboring second conductivity type lightly doped well 50 is adjacent to them; and a deep isolation trench 48 located between the two neighboring first conductivity type lightly doped well 52 is adjacent to them. A deep isolation trench 48 located between the first conductivity type lightly doped well 52 and the second conductivity type well 46 is adjacent to them. In other words, the deep isolation trenches 48 can separate the second conductivity type lightly doped wells 50 and the first conductivity type lightly doped wells 52 whereby each doped well is isolated.

When the suppressor is biased, the electrostatic discharge (ESD) current flowing these doped wells is a lateral path. After well drive-in process, the second conductivity type lightly doped wells 50 and the first conductivity type lightly doped wells 52 will not be affected by the second conductivity type well 46 due to the deep isolation trenches 48. In addition, the more the numbers of the diodes 58 and 64 connected in series, the lower the input capacitance of the suppressor. As a result, the third embodiment has the lower low input capacitance than the first embodiment.

The third embodiment is shown by another conductivity type. When the first conductivity type substrate 42 and the first conductivity type lightly doped wells 52 are respectively a P-type substrate and P-type lightly doped wells, the second conductivity type lightly doped wells 50 and the second conductivity type well 46 are respectively N-type lightly doped wells and an N-type well. And then, the first and second heavily doped areas 54 and 56 of each second conductivity type lightly doped well 50, the third and fourth heavily doped areas 60 and 62 of each first conductivity type lightly doped wells 52, the fifth, sixth, and seventh 66, 68, and 70 heavily doped areas correspond to the conductivity type of the substrate 42 and each doped well 50, 52, and 46 to be changed. Besides, the first heavily doped area 54 of the first second conductivity type lightly doped well 50, the fifth and sixth heavily doped areas 66, and 68 are connected with the high voltage Vcc. Also, the fourth heavily doped area 62 of the last first conductivity type lightly doped well 52 and the seventh heavily doped area 70 are connected with the low voltage, whereby the first and second heavily doped areas 54 and 56 of the second conductivity type lightly doped wells 50, and the third and fourth heavily doped areas 60 and 62 of the first conductivity type lightly doped wells 52 are all biased.

In conclusion, the deep isolation trenches are arranged in the substrate so that each doped well is isolated. Therefore, the suppressor of the present invention has the ultra input capacitance to benefit the signal performance.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A lateral transient voltage suppressor with ultra low capacitance, comprising
   a first conductivity type substrate;
   at least one diode cascade structure arranged in said first conductivity type substrate, wherein said diode cascade structure further comprises
      at least one second conductivity type lightly doped well arranged in said first conductivity type substrate, wherein a first heavily doped area and a second heavily doped area are arranged in said second conductivity type lightly doped well, and wherein said first heavily doped area and said second heavily doped area respectively belong to opposite conductivity types; and
      at least one first conductivity type lightly doped well arranged in said first conductivity type substrate and neighboring said second conductivity type lightly doped well, wherein a third heavily doped area and a fourth heavily doped area are arranged in said first conductivity type lightly doped well, wherein said third heavily doped area and said fourth heavily doped area respectively belong to opposite conductivity types, and wherein said second heavily doped area is connected with said third heavily doped area, and wherein said second heavily doped area and said third heavily doped area respectively belong to opposite conductivity types;

a second conductivity type well arranged in said first conductivity type substrate and neighboring said diode cascade structure, wherein a fifth heavily doped area, a sixth heavily doped area and a seventh heavily doped area are arranged in said second conductivity type well, and wherein a conductivity type of said fifth heavily doped area is opposite to a conductivity type of said sixth and seventh heavily doped areas; and a plurality of deep isolation trenches arranged in said first conductivity type substrate, having a depth greater than depths of said second conductivity type lightly doped well, said second conductivity type well and said first conductivity type lightly doped well, and separating said second conductivity type lightly doped well, said second conductivity type well and said first conductivity type lightly doped well.

2. The lateral transient voltage suppressor with ultra low capacitance according to claim 1, wherein said second heavily doped area and third heavily doped area are jointly connected to a lead.

3. The lateral transient voltage suppressor with ultra low capacitance according to claim 1, wherein when there is a plurality of said diode cascade structures, said diode cascade structures are horizontally arranged in said first conductivity type substrate, and wherein said deep isolation trenches also separate said diode cascade structures.

4. The lateral transient voltage suppressor with ultra low capacitance according to claim 1, wherein said first heavily doped area and said second conductivity type lightly doped well belong to a same conductivity type, and wherein said second heavily doped area and said first conductivity type substrate belong to a same conductivity type, and wherein said third heavily doped area and said first heavily doped area belong to a same conductivity type, and wherein fourth heavily doped area and said second heavily doped area belong to a same conductivity type, and wherein said fifth heavily doped area and said third heavily doped area belong to a same conductivity type, and wherein said sixth heavily doped area, said seventh heavily doped area and said fourth heavily doped area belong to a same conductivity type.

5. The lateral transient voltage suppressor with ultra low capacitance according to claim 4, wherein said first, fifth and sixth heavily doped areas are connected with a low voltage, and wherein said fourth and seventh heavily doped areas are connected with a high voltage.

6. The lateral transient voltage suppressor with ultra low capacitance according to claim 5, wherein said low voltage is a ground voltage.

7. The lateral transient voltage suppressor with ultra low capacitance according to claim 1, wherein when there are a plurality of said second conductivity type lightly doped wells and a plurality of said first conductivity type lightly doped wells, said second conductivity type lightly doped wells cluster together, and said first conductivity type lightly doped wells cluster together, and wherein said second conductivity type lightly doped wells are cascaded via connecting said first and second heavily doped areas, and wherein said first conductivity type lightly doped wells are cascaded via connecting said third and fourth heavily doped areas, and wherein one said second conductivity type lightly doped well is adjacent to one said first conductivity type lightly doped well and connected with said first conductivity type lightly doped well via connecting said second and third heavily doped areas.

8. The lateral transient voltage suppressor with ultra low capacitance according to claim 7, wherein said first heavily doped area of the first said second conductivity type lightly doped wells is connected with a low voltage, and wherein said fourth heavily doped area of the last said first conductivity type lightly doped well is connected with a high voltage, whereby said first, second, third, and fourth heavily doped areas are biased.

9. The lateral transient voltage suppressor with ultra low capacitance according to claim 8, wherein said low voltage is a ground voltage.

10. The lateral transient voltage suppressor with ultra low capacitance according to claim 7, wherein said second conductivity type lightly doped wells and said first conductivity type lightly doped wells are horizontally arranged in said first conductivity type substrate, and wherein said deep isolation trenches separate said second conductivity type lightly doped wells and said first conductivity type lightly doped wells.

11. The lateral transient voltage suppressor with ultra low capacitance according to claim 1, wherein when said first conductivity type substrate and said first conductivity type lightly doped well are respectively an N-type substrate and an N-type lightly doped well, said second conductivity type lightly doped well and said second conductivity type well are respectively a P-type lightly doped and a P-type well.

12. The lateral transient voltage suppressor with ultra low capacitance according to claim 1, wherein when said first conductivity type substrate and said first conductivity type lightly doped well are respectively a P-type substrate and a P-type lightly doped well, said second conductivity type lightly doped well and said second conductivity type well are respectively an N-type lightly doped and an N-type well.

13. The lateral transient voltage suppressor with ultra low capacitance according to claim 1, wherein each of said second conductivity type lightly doped well, said second conductivity type well and said first conductivity type lightly doped well is adjacent to said deep isolation trenches neighboring them.

14. The lateral transient voltage suppressor with ultra low capacitance according to claim 1, wherein said deep isolation trenches comprise a dielectric material.

* * * * *